United States Patent [19]

Ishibashi et al.

[11] Patent Number: 5,134,581
[45] Date of Patent: Jul. 28, 1992

[54] HIGHLY STABLE SEMICONDUCTOR MEMORY WITH A SMALL MEMORY CELL AREA

[75] Inventors: Koichiro Ishibashi, Tokyo; Katsuro Sasaki, Fuchu; Katsuhiro Shimohigashi, Musashimurayama; Toshiaki Yamanaka, Iruma; Naotaka Hashimoto, Hachioji; Takashi Hashimoto, Hachioji, Japan; Akihiro Shimizu, Akishima, all of Japan

[73] Assignees: Hitachi, Ltd.; Hitachi VLSI Engineering Corp., both of Tokyo, Japan

[21] Appl. No.: 604,469

[22] Filed: Oct. 29, 1990

[30] Foreign Application Priority Data

Nov. 1, 1989 [JP] Japan .................... 1-282984

[51] Int. Cl.$^5$ .................... G11C 11/40; G11C 8/00
[52] U.S. Cl. .................... 365/181; 365/154; 365/156; 365/189.05
[58] Field of Search ........... 365/154, 156, 181, 190, 365/182; 357/23.1, 41, 51

[56] References Cited

U.S. PATENT DOCUMENTS 4,623,989 11/1986 Blake .................... 365/156
4,760,561 7/1988 Yamamoto et al. .................... 365/154

OTHER PUBLICATIONS

S. Yamamoto et al., "A 256K CMOS RAM with Variable-Impedance Loads" ISSCC Feb. 13, 1985, pp. 58–59.
T. Toyabe et al., "A Soft Error Rate Model for MOS Dynamic RAM'S", IEEE Transactions on Electron Devices, vol. ED-29, No. 4, Apr. 1, 1982, pp. 732–737.
K. Yuzuriha et al., "A New Process Technology for a 4Mbit SRAM with Polysilicon Load Resistor Cell" 1989 Syposium A VLSI Technology, Digest of Technical Papers pp. 61–62.
K. Ishibashi, "An α-immune 2V Suply Voltage SRAM Using Polysilicon PMOS Load Cell" 1989 Symposium on VLSI Circuit, Digest of Technical Papers, pp. 29–30.
"A New Isolation Technology for VLSI", Extended Abstracts of the 17th Conf. on Solid State Devices and Materials, 1985 pp. 337–340 (Nojiri et al).
T. Kaga et al, "Advanced OSELO Isolation with Shallow Grooves for Three-quarter Micron ULSIs", Extended Abstracts of 18th (1986 Int'l) Conference on Solid State Devices and Materials, pp. 61–64.

*Primary Examiner*—Stuart N. Hecker
*Assistant Examiner*—Jack A. Lane
*Attorney, Agent, or Firm*—Antonelli, Terry, Stout & Kraus

[57] ABSTRACT

In order to obtain a highly stable SRAM cell having a small cell area, a cell ratio R is set to be $R=(W_{DEFF}/L_{DEFF})/(W_{TEFF}/L_{TEFF})<3$ where $L_{DEFF}$ and $W_{DEFF}$ denote an effective channel length and an effective channel width of two driver MOSFETs 3 and 4 respectively, and $L_{TEFF}$ and $W_{TEFF}$ denote an effective channel length and an effective channel width of two transfer MOSFETs 5 and 6 respectively. Further, a maximum current $I_R$ flowing into the active loads MOSFETs 1 and 2 is set to be greater than a current $I_L$ ($1\times10^{-8}$ A) that flows into the driver MOSFET 5 when a threshold voltage is applied across the gate and the cource of the MOSFET 5. The pair of active load MOSFETs 1 and 2 are stacked on the driver MOSFETs 3 and 4 and on the transfer MOSFETs 5 and 6.

16 Claims, 8 Drawing Sheets $$\frac{W_{DEFF}/L_{DEFF}}{W_{TEFF}/L_{TEFF}} < 3$$

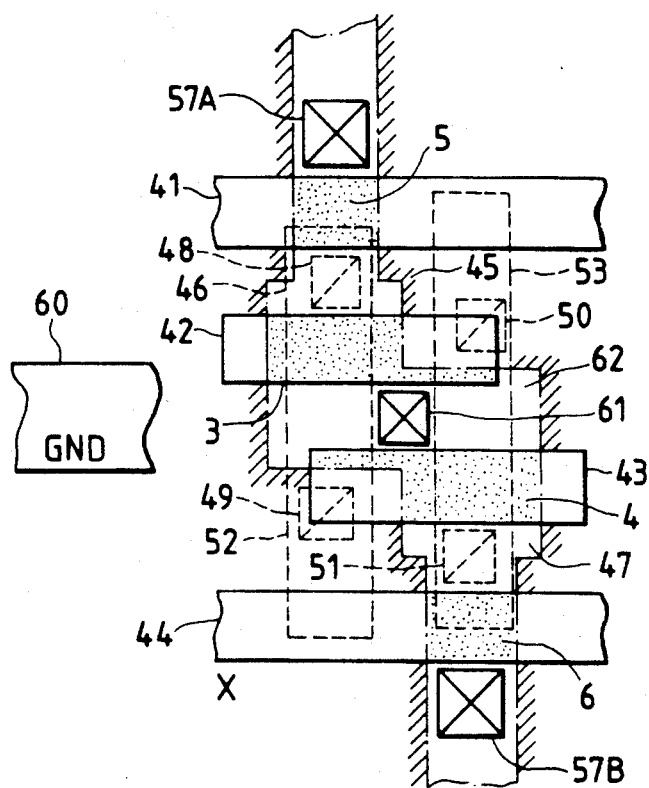
FIG. 4(a)
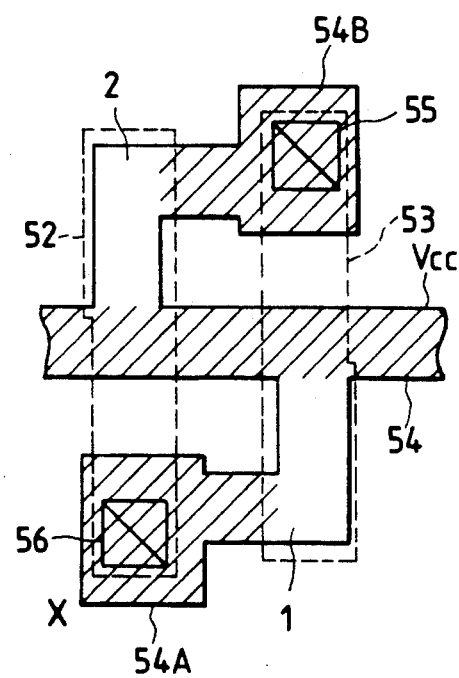
FIG. 4(b)
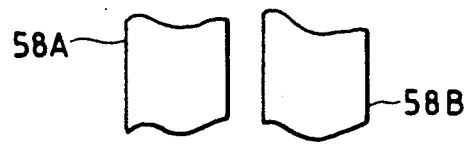

HIGHLY STABLE SEMICONDUCTOR MEMORY WITH A SMALL MEMORY CELL AREA

BACKGROUND OF THE INVENTION

1. Field of the Invention

The present invention relates to a semiconductor memory, and particularly to a semiconductor memory adapted to a static RAM that consists of an integration of many static memory cells.

2. Description of the Prior Art

SRAM cells using a high-resistance load have been disclosed in 1989 Symposium on VLSI Technology, Digest of Technical Papers, 1989, pp. 61-62, hereinafter referred to as first prior art.

SRAM cells using a polysilicon TFT (thin film transistor) have been disclosed in 1989 Symposium on VLSI Circuit, Digest of Technical Papers, 1989, pp. 29-30, hereinafter referred to as second prior art.

Further, driving the word lines with pulses has been disclosed in 1985 IEEE International Solid-State Circuits Conference, Digest of Technical Papers, pp. 58-59, hereinafter referred to as third prior art.

SUMMARY OF THE INVENTION

In the SRAM cells having high-resistance loads, such as disclosed in the first prior art, the current drivability ratio of a driver MOSFET to a transfer MOSFET must be greater than 3 in order to maintain a sufficiently large noise margin. In this case, in order for the driver MOSFET to produce sufficiently great current drivability, the channel width thereof must be more than three times as great as the channel width of the transfer MOSFET, and it is difficult to further decrease the channel width to make the memory cell smaller. In the above prior art, furthermore, the channel direction of the transfer MOSFETs is at right angles with the channel direction of the driver MOSFETs resulting in an increase in the area of high-impurity-concentration regions that serve as the source region of transfer MOSFETs and the drain region of driver MOSFETs, making it difficult to decrease the memory cell area any more. It is further expected that the device becomes less immune to soft error due to the carriers, induced by so-called alpha rays, collected in the high-impurity-concentration regions.

The above second prior art shows that the SRAM cells consisting of polysilicon TFTs can be operated at a voltage lower than that of the memory cells of the type using polysilicon resistance loads that are widely used for the SRAM, since the memory cells of polysilicon TFTs exhibit increased immunity against soft errors caused by alpha rays and improved electric stability. Even in the above-mentioned second prior art, however, the driver MOSFET formed on the substrate must have a channel width comparable with that of the conventional cells of the resistance load type, and it is difficult to further decrease the area of the memory cells.

According to the above third prior art, the word lines are driven with pulses in order to decrease the electric current that flows into the memory cells over a long cycle time. If the pulse width at this time is set to be nearly equal to the minimum cycle time, it is possible to shorten the time in which the electric current flows into the memory cells over the long cycle time and to decrease an average electric current. When the memory is operated with the minimum cycle time, however, the word lines are not driven with pulses but rather stay under the condition of being activated at all times. At this moment, the electric charge stored at the node in the memory cell flows into a bit line from the transfer MOSFET, and the potential at the node drops. When the ratio is greater than 3, data is not destroyed by the drop of potential at the node. When the ratio is smaller than 3, however, potentials at the two nodes are reversed when the potential at a node drops, and data is destroyed.

Using the SRAM cells shown in FIG. 3, on the other hand, the present inventors have attempted to decrease the size of the SRAM cells maintaining a cell ratio of $$(W_{DEFF}/L_{DEFF})/(W_{TEFF}/L_{TEFF}) < 3$$

where $L_{DEFF}$ and $W_{DEFF}$ denote an effective channel length and an effective channel width of the two driver MOSFETs M1 and M2, respectively, and $L_{TEFF}$ and $W_{TEFF}$ denote an effective channel length and an effective channel width of the two transfer MOSFETs M3 and M4, respectively. The inventors have discovered that the cell data is inverted when data is read out from the following cells.

That is, referring to FIG. 3, a condition is assumed in which the driver MOSFET M1 is turned off and the driver MOSFET M2 is turned on before data is read out from the cell. Therefore, the data-storing node on the left side of the cell has a high level $V_H$ and the data storing node on the right side of the cell has a low level $V_L$.

If a word line 7 has a power source voltage Vcc of high level to read data from the cell, the transfer MOSFETs M3 and M4 are turned on. On the other hand, a pair of bit lines 8 assume a power source voltage Vcc of the high level due to the action of bit line loads 9 and 10 connected to the pair of bit lines 8.

Here, if the cell ratio has been set to be $(W_{DEFF}/L_{DEFF})/(W_{TEFF}/L_{TEFF}) < 3$, the transfer MOSFETs M3 and M4 which are turned on exhibit impedances that are close to the impedance of the driver MOSFET M2 that is turned on.

Therefore, the voltage at the data-storing node on the right side of the cell that has been at the low level $V_L$ due to the high-level voltage of the bit lines 8 is boosted to a voltage that is close to the threshold voltage Vth of the driver MOSFET M1.

On the other hand, when a voltage close to the threshold voltage Vth is applied across the gate and the source of MOSFET M1, a current $I_L$ of about $1 \times 10^{-8}$ A flows through the drain-source path thereof.

Therefore, the drive MOSFET M1 under the turned-off condition permits an increased current $I_L$ to flow whereby the high level $V_H$ at the data-storing node on the left side of the cell drops and the cell data is undesirably inverted.

In order to prevent undesired inversion of cell data in the memory cell of FIG. 3, therefore, a pair of loads 1 and 2 having smaller impedances are used for the memory cell such that a load current $I_R$ greater than the above-mentioned current $I_L$ will flow into the load 1. By setting the current $I_L$ to be smaller than the load current $I_R$ as described above, the potential at the data-storing node on the left side is maintained at the high level $V_H$ and the cell data is prevented from being undesirably inverted.

However, the present inventors have also discovered the fact that with this method in which the pair of loads 1 and 2 have small impedances, the electric power is consumed by the memory cell significantly increases under a data-holding condition that keeps the data line 7 at a non-activated level.

The present invention was accomplished based upon the results studied by the present inventors, and its object is to maintain electric stability, to decrease the area of the memory cells, and to decrease the consumption of electric power by the memory cells despite a small cell ratio.

According to a representative embodiment of the present invention, the above-mentioned object is achieved in a manner as described below.

That is, when the effective channel length and the effective channel width of the two driver MOSFETs are respectively denoted by $L_{DEFF}$ and $W_{DEFF}$, and when the effective channel length and the effective channel width of the two transfer MOSFETs are respectively denoted by $L_{TEFF}$ and $W_{TEFF}$, the cell ratio R is set to be, $$R = (W_{DEFF}/L_{DEFF})/(W_{TEFF}/L_{TEFF}) < 3$$

Further, a pair of loads consist of active load FETs, with current flowing therethrough changing according to the potentials at a pair of data nodes. The maximum current $I_R$ flowing into the active loads is set to be greater than the aforementioned current $I_L$.

Here, the maximum current $I_R$ of the pair of active load FETs can be easily set by setting the channel length and the channel width of the pair of active loads FETs.

Further, the pair of active loads are constituted by polysilicon TFTs deposited on the upper layer of the driver MOSFETs and the transfer MOSFETs.

The cell ratio is set to be small and the polysilicon TFTs that serve as active loads are formed on the upper portions of the drive or transfer MOSFETs, making it possible to reduce the areas occupied by the memory cells.

Since the current $I_R$ flowing into the polysilicon TFT that serves as the active load is set to be greater than the above-mentioned current $I_L$, the cell data is prevented from being undesirably inverted.

Further, under the condition where the memory cell data is held such that the data line (7) is at a non-activated level and where the potentials of the pair of data-storing nodes are stabilized, only a very small off-current of one driver MOSFET (3) whose gate is connected to the data-storing node of low potential $V_L$ and a very small off-current of the pair of polysilicon TFTs (2) whose gates are connected to the data-storing node of high potential $V_H$ flow into a data holding cell as a consumption current. It is therefore possible to decrease the electric power consumption by the memory cell that is holding data (see FIG. 1).

Other objects and features of the present invention will become obvious from the following embodiments.

BRIEF DESCRIPTION OF THE DRAWINGS

FIGS. 4(a-b) are diagrams of layout of memory cells according to an embodiment of the present invention;

DESCRIPTION OF THE PREFERRED EMBODIMENTS

Embodiments of the invention will now be described in conjunction with the drawings.

Figure 1A:
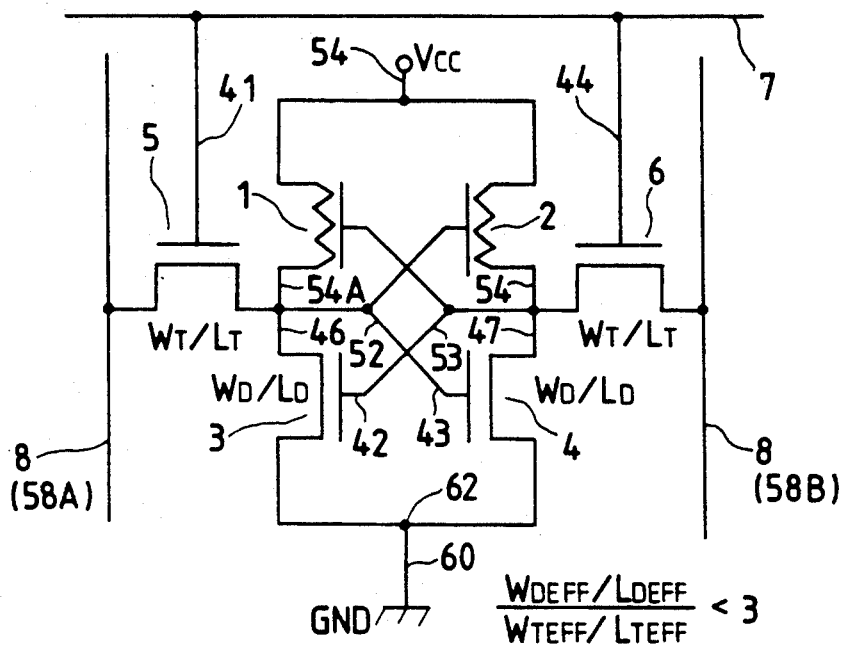
FIGS. 1(a-b) show a circuit diagram and a section view of an embodiment of the present invention.
Figure 1B:
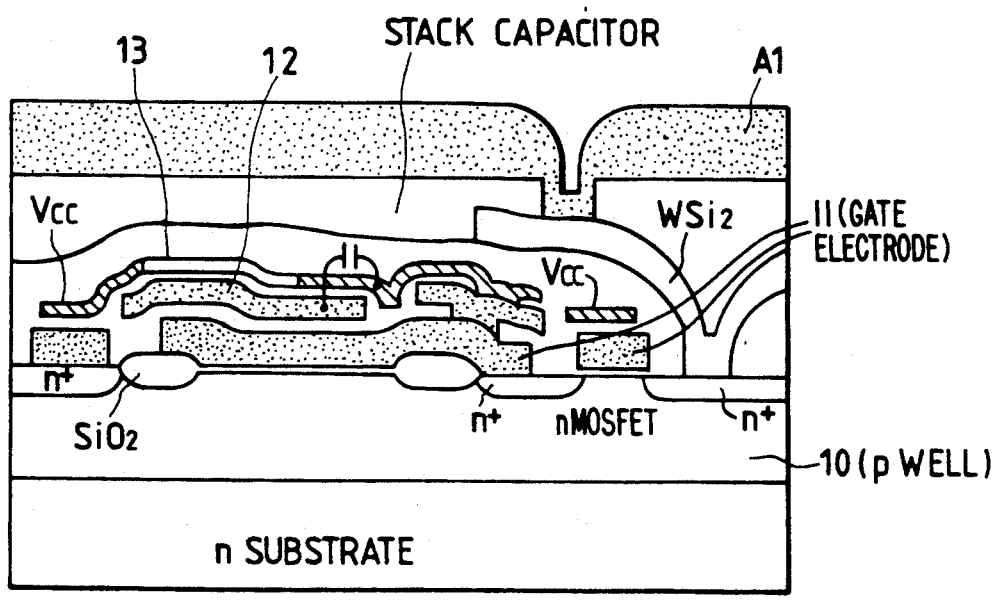

FIG. 1(a) is a circuit diagram of an embodiment of the present invention, and FIG. 1(b) is a section view of the embodiment of the present invention.

In FIG. 1(a), reference numerals 1 and 2 denote p-channel polysilicon TFTs that serve as active loads, 3 and 4 denote n-channel driver MOSFETs having an effective channel length $L_{DEFF}$ and an effective channel width $W_{DEFF}$. Reference numeral 7 denotes a word line and 8 denotes a complementary bit line (or pair of complementary bit lines). Here, if the working channel width is denoted by $W_M$ and the offset value of the channel width is denoted by $\Delta W$, the effective channel width $W_{EFF}$ is given by $W_{EFF} = W_M - \Delta W$. Further, if the working channel length is denoted by $L_M$ and the offset value of the channel length is denoted by $\Delta L$, the effective channel length $L_{EFF}$ is given by $L_{EFF} = L_M - \Delta L$.

In the section view of FIG. 1(b), an n-channel MOSFET is formed in the p-type well on a silicon substrate. A gate electrode 11 of the n-channel MOSFET consists of a first polysilicon layer. Further, a p-channel TFT of polysilicon is formed thereon having a gate electrode 12 consisting of a second polysilicon layer and a channel 13 consisting of a third polysilicon layer.

This embodiment has the structure in which the polysilicon TFTs are formed on the transfer MOSFETs and on the driver MOSFETs as shown in FIG. 1(b), and is characterized by a memory cell ratio $(W_{DEFF}/L_{DEFF})/(W_{TEFF}/L_{TEFF})$ which is smaller than 3.

In the memory cells based on the prior art, an electrically stable condition could not be obtained unless the memory cell ratio was greater than 3, and $W_{DEFF}$ had to be more than 3 times as great as $W_{TEFF}$.

According to this embodiment as described earlier, however, a memory cell is comprised of polysilicon TFTs 1 and 2 that serve as active loads and that are capable of supplying an on-current of larger than $1 \times 10^{-8}$ A at the time of reading data from the cell. Therefore, the memory cell ratio can be decreased to smaller than 3 and, as a result, $W_{DEFF}$ can be made smaller than that of the prior art.

In addition, the polysilicon TFTs that are formed on the driver or transfer MOSFETs as shown in FIG. 1(b) do not cause the memory cell areas to increase. In this embodiment, therefore, the area occupied by the cell can be made smaller than that of the prior art.

Figure 2A:
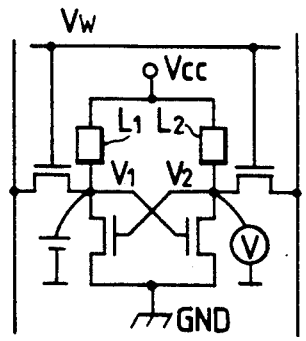
FIGS. 2(a-e) show a circuit diagram of a SRAM memory cell and diagrams showing simulated waveforms demonstrating electrical stability on which the present invention is based.

FIG. 2 shows waveforms of simulation demonstrating electrical stability on which the present invention is based, and wherein FIG. 2(a) is a circuit diagram of a SRAM memory cell, a node on the left side of the memory cell being denoted by $V_1$ and a node on the right side being denoted by $V_2$. The load element $L_1$ is connected to the data node on the left side and the load element $L_2$ is connected to the data node on the right side. In the memory cell, furthermore, the driver MOSFETs have channel lengths and threshold voltages that are different by about 15% between the right side and the left side, so that the memory cell can be easily latched in a predetermined direction. That is, the driver MOSFETs in the cell are so unbalanced that the node $V_1$ will easily acquire a high potential.

FIGS. 2(b), 2(c), 2(d) and 2(e) illustrate the relationships between the voltages $V_1$ and $V_2$ when the power source Vcc of the load and the word line have a voltage $V_W$ of 4 volts and the bit line has a voltage of 4 volts.

Figure 2B:
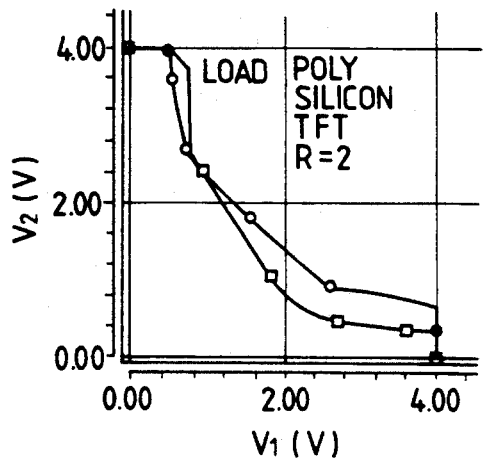
Figure 2C:
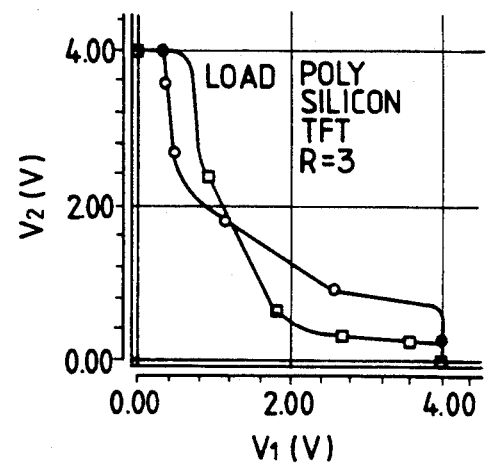
Figure 2D:
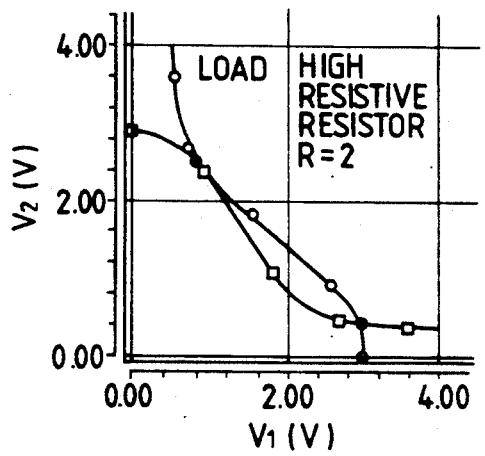
Figure 2E:
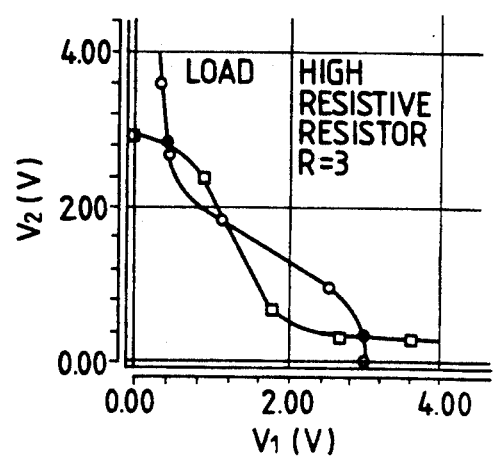

FIGS. 2(b) and 2(c) illustrate the case when the load elements consist of polysilicon TFTs, and FIGS. 2(d) and 2(e) illustrate the case when the load elements are composed of polysilicon having high resistance. Each diagram has two curves representing the case when $V_2$ is observed while forcibly changing $V_1$ and the case when $V_1$ is observed while forcibly changing $V_2$. Intersecting points of these curves represent stable points of the memory cell.

Referring to FIG. 2(e), three intersecting points appear clearly when the loads have a high resistance and the cell ratio is 3. The middle intersecting point represents a metastable point, and the node voltages of the memory cell become most stable at intersecting points on both sides. When the loads have a high resistance, therefore, stable condition is maintained at intersecting points on both sides provided the cell ratio is not smaller than 3. That is, the data is kept held.

When the cell ratio is 2, however, there appear only two intersecting points as shown in FIG. 2(d) although the loads have a high resistance. In the memory cell in which the loads have a high resistance, therefore, the data is not stored when the cell ratio is 2. When the loads have a high resistance, therefore, the cell ratio should be 3 or greater in order to stabilize the operation of the memory cell.

In the case of the cell using polysilicon TFTs, on the other hand, there appear three intersecting points as shown in FIG. 2(b) even when the cell ratio is 2. This is because, since the loads consist of polysilicon TFTs which are active elements, the equivalent resistance of the loads can be lowered. In the cell using polysilicon TFTs, therefore, it is possible to set the cell ratio to a value which is smaller than 3.

Figure 3A:
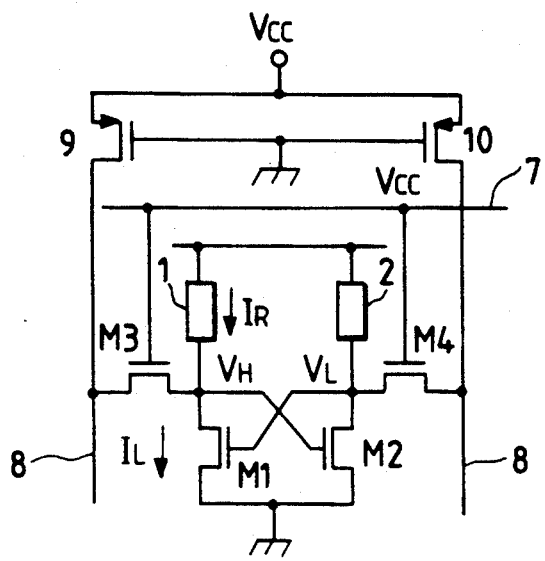
FIGS. 3(a) and 3(b) show a circuit diagram of a SRAM cell and a diagram for explaining the effects of load currents of the SRAM cell respectively.
Figure 3B:
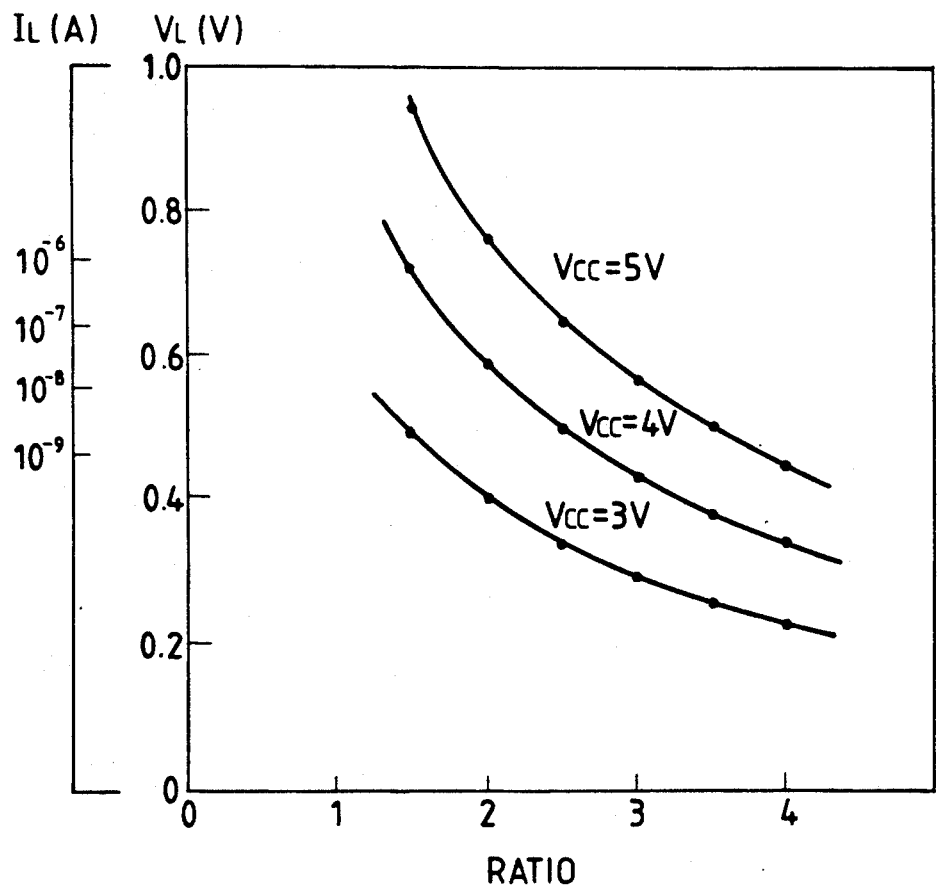

FIGS. 3(a) and 3(b) are diagrams explaining the effects of load currents of the SRAM cell. The diagram of FIG. 3(a) shows the circuit of a memory cell. In the circuit diagram of FIG. 3(a), symbol $V_H$ denotes a data node potential of high voltage, $V_L$ denotes a data node potential of low voltage, and $I_L$ denotes a current that flows into the drive MOSFET M1 in response to the low data node potential $V_L$.

In the circuit diagram of FIG. 3(a), furthermore, symbol $I_R$ denotes a current that flows into the loads 1 and 2 of the memory cell, the current $I_R$ corresponding to the on-current of the TFTs in the cell that uses polysilicon TFTs as loads. When the data is to be read out from the memory cell, the high data node potential $V_H$ is determined by a relative magnitudes of the currents $I_L$ and $I_R$. As the current $I_L$ increases, therefore, the current $I_R$ flowing into the load can no longer maintain the data node potential $V_H$ at a high voltage, and the data is finally inverted.

If $V_H = V_{cc}$, the potential of the bit line 8 is Vcc and the cell ratio is $\beta$ under the reading condition, then the low data node potential $V_L$ is given by the following equation, $$V_L = (V_{cc} - V_{THO}) \times (1 - \beta/\sqrt{(1 + \beta)})$$

where $V_{THO}$ denotes a threshold voltage.

In the diagram of FIG. 3(b), the above equation is plotted with the power source voltage as a parameter. The ordinate of this diagram represents the node potential $V_L$ of low data node voltage as well as the current $I_L$ that flows into the drive MOSFET M1 in response to the low data node voltage $V_L$. That is, when the low data node voltage $V_L$ is 0.55 V which is the threshold voltage of the MOSFET, the current $I_L$ becomes $1 \times 10^{-8}$ A. Under the conditions of a cell ratio and a power source voltage in which $V_L$ becomes 0.55 V, therefore, the relation becomes $I_L > I_R$ and $V_H$ decreases unless the current $I_R$ flowing into the load becomes greater than $1 \times 10^{-8}$ A. Or, the cell data is inverted. When Vcc is 5 V in FIG. 3(b), the data node potential $V_L$ becomes greater than the threshold voltage of 0.55 V if the cell ratio is smaller than 3. Therefore, when $I_R$ is smaller than $1 \times 10^{-8}$ A as in the case of the cell having high-resistance loads, the data node potential $V_H$ decreases and the data can no longer be maintained provided the cell ratio is smaller than 3.

On the other hand, when the load current is greater than $1 \times 10^{-8}$ A as a result of using the polysilicon TFTs 1 and 2 that serve as active loads as in the embodiment of the present invention shown in FIG. 1, it becomes possible to maintain the cell data even when the ratio is smaller than 3.

In other words, when the power source voltage Vcc is 5 V, the low data node potential $V_L$ is smaller than 0.55 V provided the cell ratio is up to 3 and when the power source voltage Vcc is 4 V, the low data node potential $V_L$ is smaller than 0.55 V provided the cell ratio is up to 2.10. Therefore, the cell data can be maintained provided the current flowing into the polysilicon TFTs 1 and 2 is greater than $1 \times 10^{-8}$ A.

In the embodiment of FIG. 1 as described above, the cell data is maintained without being inverted even when the memory cell ratio is decreased to below 3. With the memory cell ratio being decreased in this embodiment, therefore, the channel width $W_{DEFF}$ of the drive MOSFETs M1 and M2 can be made smaller than that of the prior art, and the memory cell area can also be made smaller than that of the prior art.

FIGS. 4(a) and 4(b) are the layout of memory cells according to the embodiment of the present invention. Here, FIGS. 4(a) and 4(b) show the layout of the same memory cells, but are drawn separately to avoid complexity of drawing.

In FIG. 4(a), reference numerals 41, 42, 43 and 44 denote first polysilicon layers that form the gate electrodes of MOSFETs, and 45 denotes a line showing an end of a thick field oxide film for isolating the elements. Channel portions (dotted portions) of MOSFETs 3, 4, 5 and 6 of FIG. 1 are formed on the portions where the first polysilicon layers 41 to 44 are overlapped on a thin gate oxide film formed inside the line 45, and the portions free of overlapping are high impurity-concentration regions that serve as source or drain regions of the MOSFETs. Among them, the high impurity-concentration regions 46 and 47 serve as data-storing nodes in the memory cell and 62 denotes a node that serves as ground electrode of the memory cell. Reference numerals 48 and 49 denote contact holes through which the high impurity-concentration region 46 (data-storing node to which are connected the MOSFETs 3 and 5) and the polysilicon layer 43 (gate electrode of the drive MOSFET 4) are connected together by the second polysilicon layer 52. Similarly, reference numerals 50 and 51 denote contact holes through which the high impurity-concentration region 47 (data-storing node to which the MOSFETs 4 and 6 are connected) and the polysilicon layer 42 (gate electrode of the driver MOSFET 3) are connected together by the second polysilicon layer 53. These connections form a flip-flop circuit in the memory cell.

Here, as shown in FIG. 4(b), the above-mentioned second polysilicon layers 52 and 53 also work as lower gate electrode layers of the polysilicon TFTs 1 and 2 that are active loads in FIG. 1, and polysilicon channel portions of TFT 1 and 2 are formed on the portions where a third polysilicon layer 54 overlaps these gate electrodes via another gate insulating film. Contact holes 55 and 56 work to connect the second polysilicon layers 53, 52 and the third polysilicon layers 54A, 54B together.

In FIG. 4(b), hatched portions of the third polysilicon layer 54 where boron ions are highly densely implanted represent source and drain regions of the polysilicon TFTs 1 and 2 that serve as active loads. Fourth contact holes 57A and 57B are connected to the uppermost aluminum wiring layers 58A and 58B, respectively, to form bit lines 8. Reference numeral 60 denotes a grounding wiring of the memory cell, which is connected to a high impurity-concentration region 62 via a first contact hole 61. The grounding wire 60 consists of an intermediate polysilicon layer arranged between the first polysilicon layer and the second polysilicon layer.

According to the embodiment as shown in FIGS. 4(a) and 4(b), the layers 41, 42, 43 and 44 that serve as gate electrodes of MOSFETs are arranged in parallel. In the layout of SRAM memory cells, so far, the channel width of the driver MOSFET had to be increased. For this purpose, therefore, the polysilicon layers 41, 44 and the polysilicon layers 42, 43 have heretofore been arranged perpendicular to each other so as not to increase the area. According to the embodiment of the invention, however, the memory call ratio can be small, and the gate width of the driver MOSFETs needs not be significantly increased compared with the gate width of the transfer MOSFETs. Even when the electrodes of these driver MOSFETs and the transfer MOSFETs are arranged in parallel, therefore, there is no great increase in the memory cell areas. These electrodes are composed of the same polysilicon layer. When the electrodes are arranged in parallel, therefore, the distance among them is defined by a minimum working size. Therefore, the high impurity-concentration regions 46 and 47 sandwiched by the polysilicon layers inevitably have very small areas.

According to a literature (T. Toyabe, et al., "A Soft Error Rate Model for MOS Dynamic RAM's", IEEE Trans. Electron Devices, Vol. ED-29, 1982, p. 732), there has been described that the electrons formed by the alpha rays incident upon a semiconductor substrate are collected in the high impurity-concentration region which is the data-storing node and, hence, soft error is induced by alpha rays. According to this literature, furthermore, the amount of electrons collected decreases with the decrease in the area of the high impurity-concentration region. According to the embodiment of the invention in which the area of the high impurity-concentration region can be very small, therefore, the number of the collected electrons becomes small and the probability of soft error caused by alpha rays becomes very small.

In order to stably operate the memory cells, on the other hand, the storage node voltage must be maintained high as will be described later.

Figure 5A:
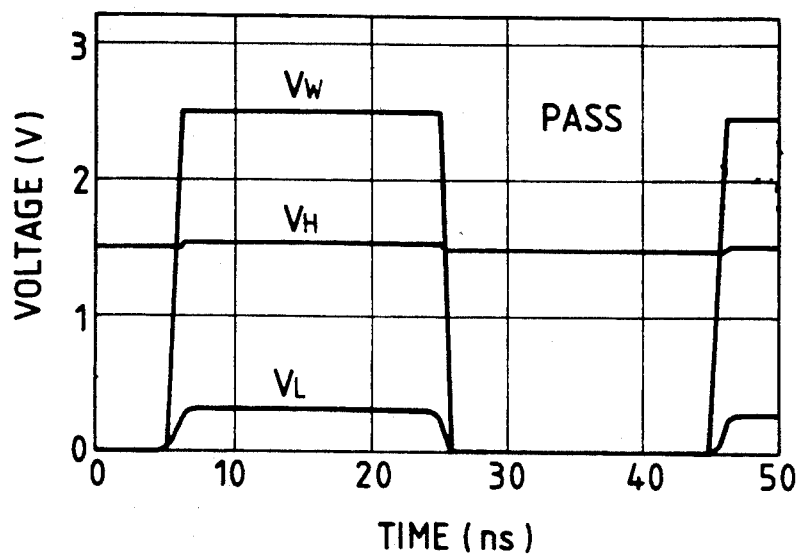
FIGS. 5(a-b) are diagrams showing simulated waveforms where data stored in the memory cell is held at the time of reading operation and where the data is destroyed.
Figure 5B:
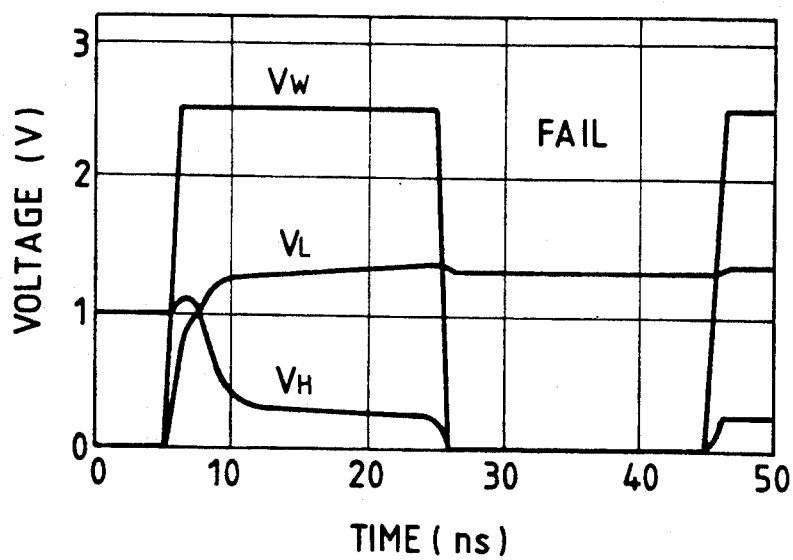

FIG. 5 shows waveforms of simulation when the stored date is maintained (FIG. 5(a)) at the time of reading operation and when the stored data is destroyed (FIG. 5(b)). In the drawings, symbol $V_W$ denotes a word line voltage, $V_H$ denotes a high node potential when the data is stored, and $V_L$ denotes a low node potential. The difference between the two resides in a difference in the high node potential before the word line rises. That is, the data is maintained in the case of FIG. 5(a) when the high node potential is high but the data is inverted in the case of FIG. 5(b) when the high node potential is low. To obtain stable operation, therefore, the high node potential must be maintained high just before the word line rises to read the data.

Figure 6A:
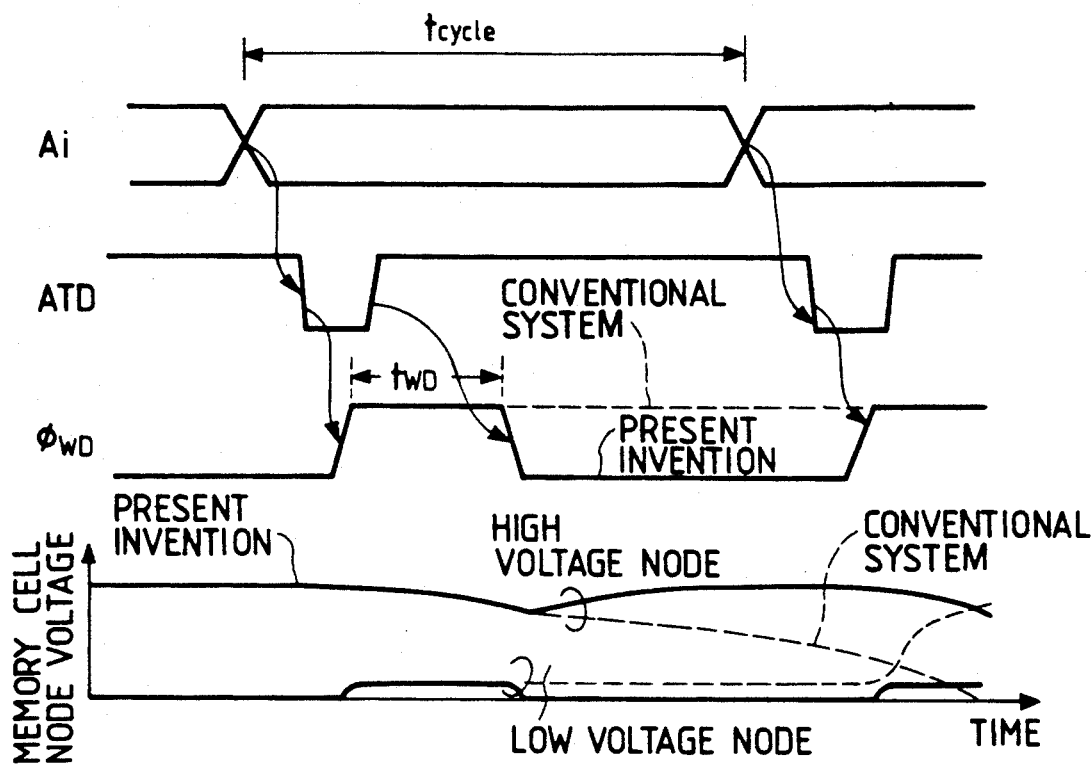
FIGS. 6(a-b) show a waveform diagram and a block diagram of the word line drive method according to the embodiment of the present invention.
Figure 6B:
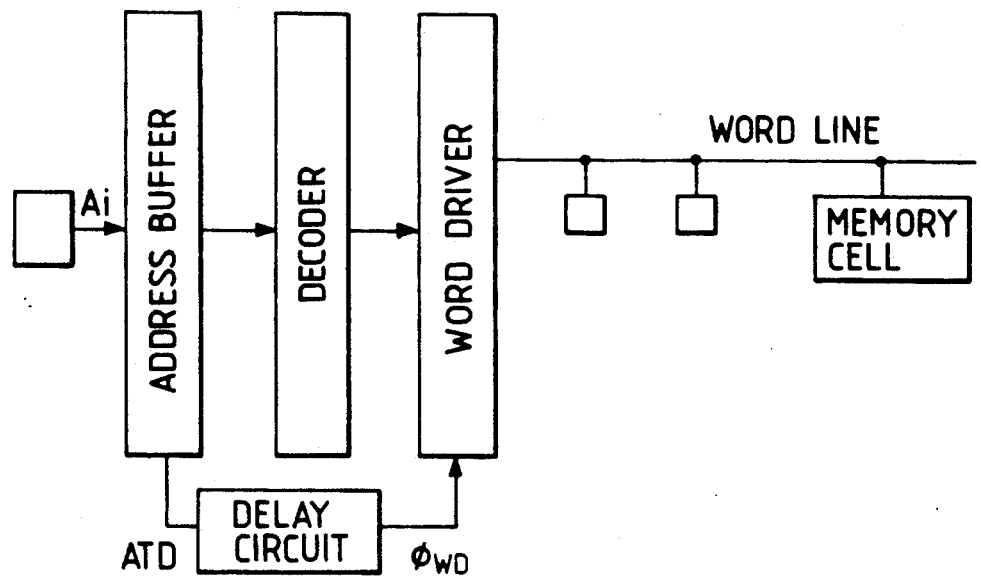

FIG. 6 illustrates a method of driving the word line according to the embodiment of the present invention, wherein FIG. 6(a) is a diagram of waveforms and FIG. 6(b) is a block diagram.

The present invention has a prerequisite of using the ATD pulses that are generated as an address signal Ai undergoes transition. An ATD pulse that is generated is extended in a delay circuit and whereby a word line activating signal $\phi_{WD}$ is generated to raise the word line and to read the data in the memory cell.

So far, as indicated by dotted lines in the waveform diagram of FIG. 6(a), the word line activation signal $\phi_{WD}$ has been set to be equal to or longer than a minimum cycle time $t_{cycle}$ (time interval between an address transition determined by the access time of a semiconductor memory and the next address transition). Therefore, if the address is changed within the minimum cycle time, the word line activation signal is continuously activated. Therefore, the word line remains risen continuously. In this case, when the memory cell has a cell ratio of smaller than 3, the high node voltage continues to decrease, and the cell data is eventually inverted.

According to the embodiment of the invention, however, the signal $\phi_{WD}$ for activating the word line 7 is deactivated during the minimum cycle time $t_{cycle}$, and the high voltage node is electrically charged by the currents of polysilicon TFTs 1 and 2 of FIG. 1 during the period of this interruption and returns to the level of the power source voltage Vcc. Therefore, the cell data is not inverted. According to the embodiment, therefore, the data in the memory cell is prevented from being inverted even when the address Ai changes at each minimum cycle time $t_{cycle}$, and the memory cells operate in an electrically stable condition.

Figure 7:
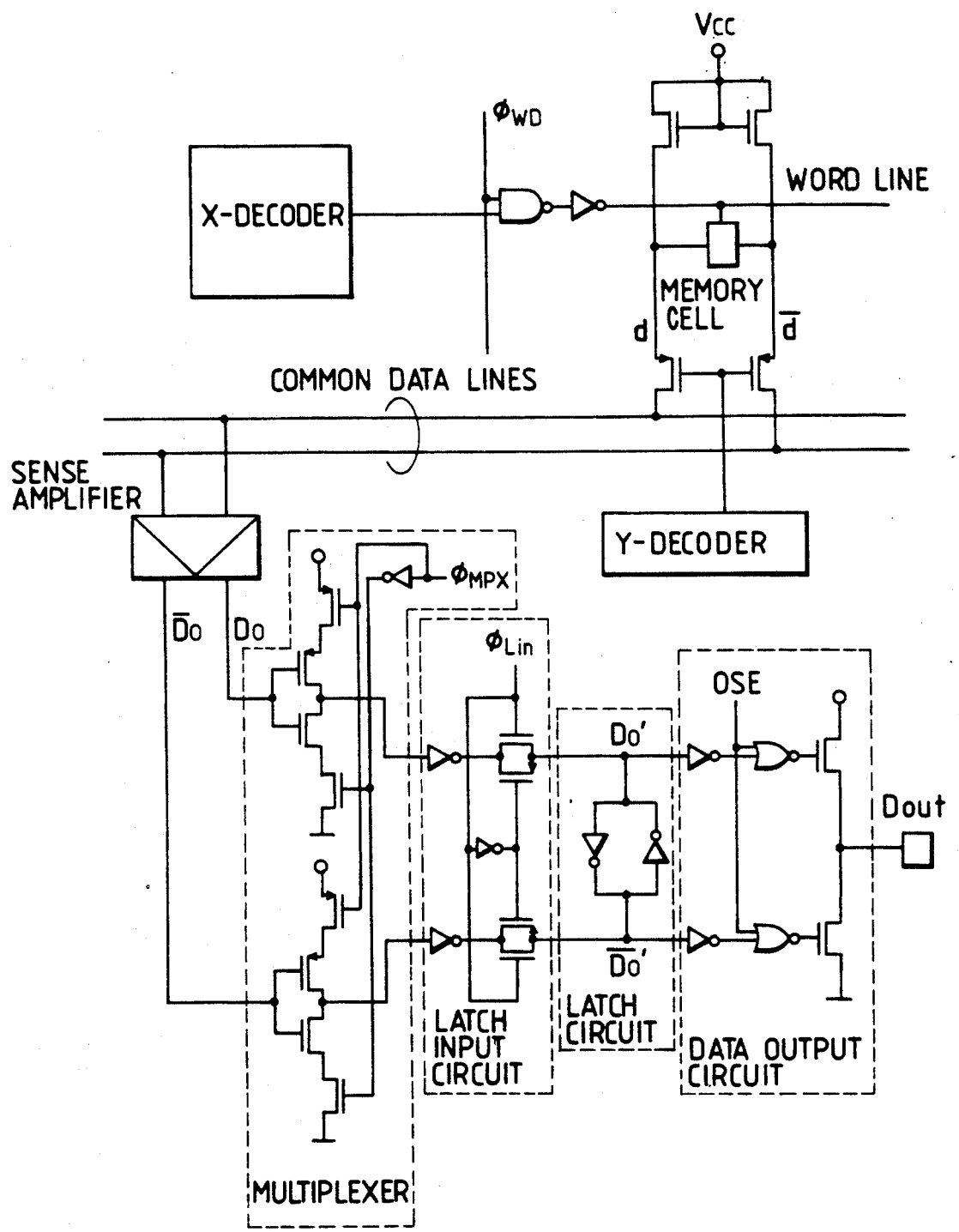
FIGS. 7 and 8 are a circuit diagram illustrating sense amplifier, data output circuit and the like according to an embodiment of the present invention, and an operation waveform diagram of this circuit respectively.
Figure 8:
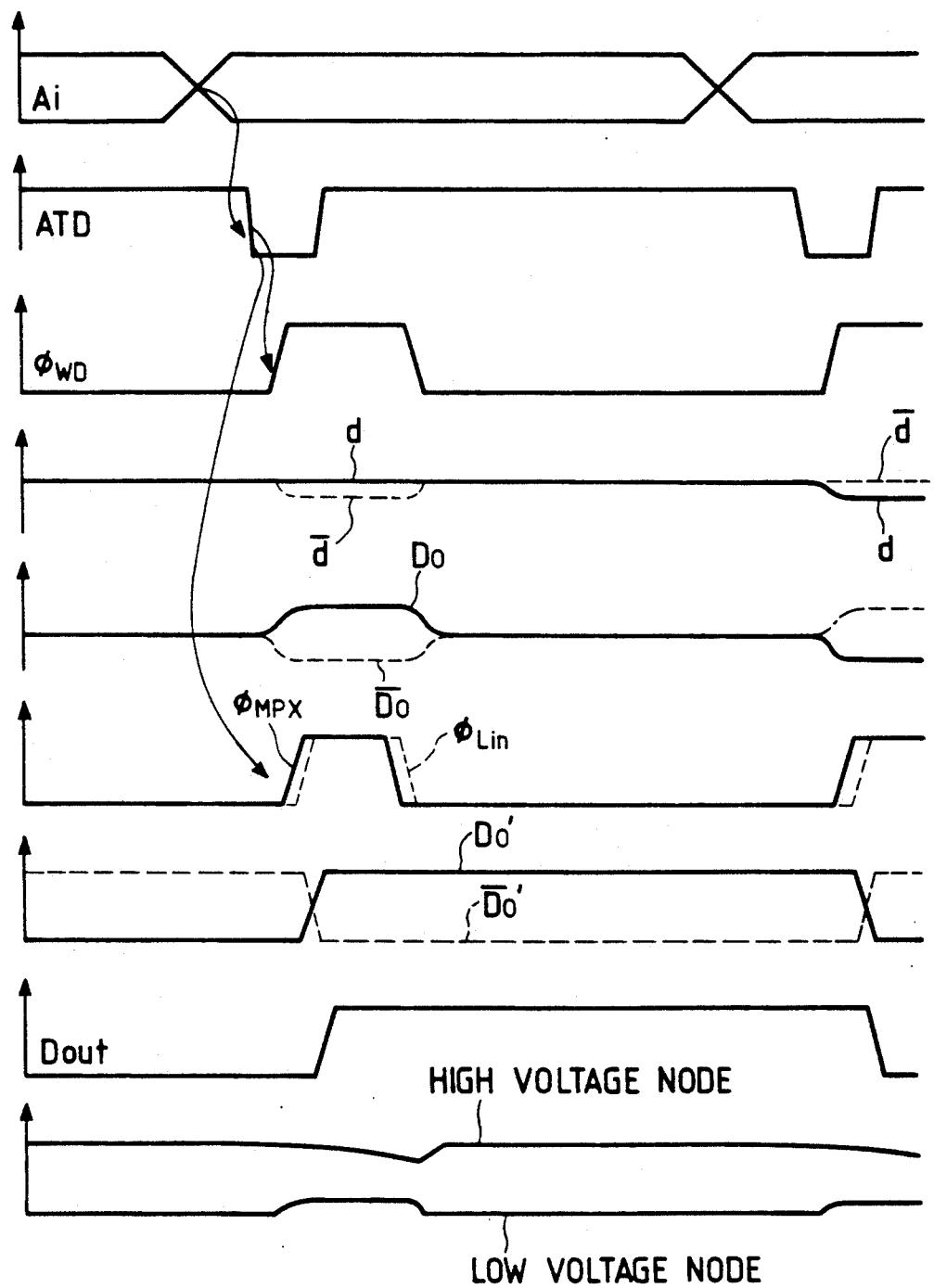

FIG. 7 is a circuit diagram showing sense amplifier, data output circuit and the like according to an embodiment of the present invention, and FIG. 8 is a diagram of waveforms of the circuit of FIG. 7. According to this embodiment just as with the embodiment of FIG. 6, the word line activation signal $\phi_{WD}$ is interrupted during the cycle. Here, however, the data output circuit is provided with a latch circuit that holds the data during the period in which the word line is no longer activated and the word line is placed under the non-activated condition.

According to this embodiment as shown in FIGS. 7 and 8, the word line is activated by the word line activation signal $\phi_{WD}$ and the signal in the memory cell is output to the data lines d, $\bar{d}$. The signal of the data lines is output to common data lines and is amplified by the sense amplifier to form signals $D_0$, $\bar{D}_0$. The amplified signals are input to the latch circuit via a multiplexer and a latch input circuit which is controlled by a pulse $\phi_{Lin}$ produced from the aforementioned ATD pulse. The pulse $\phi_{Lin}$ is activated only when the signal $\phi_{WD}$ is activated to activate the word line. The signal input to the latch circuit is written on the latch and, at the same time, data is output to a data output terminal $D_{out}$ via a data output circuit. When the data line is deactivated, on the other hand, no data signal is output to the data lines or to the common data lines, and the output signal of the sense amplifier assumes an intermediate potential. At the same time, however, the pulse $\phi_{Lin}$ is deactivated and no signal is input to the latch circuit. Therefore, the data signal stored in the latch circuit is directly input to the data output circuit, and the data can be kept sent to the data output terminal.

During the operation, the high node voltage of the memory cell tends to decrease when the word line is under the activated condition as is the case with the embodiment of FIG. 6. However, the high voltage node is electrically charged by the current of the polysilicon TFTs while the word line is under the non-activated condition and returns to the level of power source voltage Vcc, and the cell data is not inverted. Even in the embodiment of FIGS. 7 and 8, therefore, the data in the memory cell is prevented from being inverted even when the address changes at every minimum cycle time, and the electrically stable condition of the memory cell is obtained.

As described above, the present invention offers such effects as reducing the memory cell area of SRAM, reinforcing the immunity against the alpha rays, improving the electrical stability, and reducing the consumption of electric power.

What is claimed is:

1. A semiconductor memory in which static memory cells each comprised of two driver MOSFETs and two transfer MOSFETs of a first conductivity type are formed on a semiconductor substrate, wherein two FETs of a second conductivity type are formed as active loads of said memory cells and overlie at least one of the driver and transfer MOSFETs, wherein a condition $(W_{DEFF}/L_{DEFF})/(W_{TEFF}/L_{TEFF})<3$ is established in which $L_{DEFF}$ and $W_{DEFF}$ denote an effective channel length and an effective channel width of said two driver MOSFETs, respectively, and $L_{TEFF}$ and $W_{TEFF}$ denote an effective channel length and an effective channel width of said two transfer MOSFETs, respectively, and wherein a current flowing into the active load FETs is set to be greater than $1 \times 10^{-8}$ A.

2. A semiconductor memory according to claim 1, wherein the active load FETs consist of polysilicon thin film transistors (TFTs).

3. A semiconductor memory according to claim 2, wherein a condition, $t_{WD}<t_{cycle}$, is established where $t_{WD}$ denotes the width of a voltage pulse on a word line that renders said two transfer MOSFETs conductive and $t_{cycle}$ denotes the minimum cycle time of the semiconductor memory, in order to provide a time during which said two transfer MOSFETs become nonconductive, and one node in said memory cell is electrically charged by said current of said polysilicon TFTs during said nonconductive time.

4. A semiconductor memory according to claim 2, wherein the channel direction of said two transfer MOSFETs is substantially in parallel with the channel direction of said two drive MOSFETs.

5. A semiconductor memory according to claim 3, wherein the channel direction of said two transfer MOSFETs is substantially in parallel with the channel direction of said two driver MOSFETs.

6. A semiconductor memory according to claim 5, wherein the driver and transfer MOSFETs are n-channel conductivity type and said active load FETs are p-channel conductivity type.

7. A semiconductor memory according to claim 1, wherein the driver and transfer MOSFETs are n-channel conductivity type and said active load FETs are p-channel conductivity type.

8. A semiconductor memory according to claim 2, wherein the driver and transfer MOSFETs are n-channel conductivity type and said active load FETs are p-channel conductivity type.

9. A semiconductor memory of high stability in which static memory cells each comprised of two driver MOSFETs and two transfer MOSFETs of a first conductivity type are formed in a principal surface region of a semiconductor substrate, each driver MOSFET having a drain and gate cross-coupled to the gate and drain of the other driver MOSFET and said two transfer MOSFETs having individual channels coupled between a corresponding one of a pair of complementary bit lines and the drain of a driver MOSFET, respectively, wherein two FETs of a second conductivity type are formed above the principal surface region of said semiconductor substrate as active loads of said memory cell and which overlie at least one of the driver and transfer MOSFETs, wherein a condition $(W_{DEFF}/L_{DEFF})/(W_{TEFF}/L_{TEFF})<3$ is established in which $L_{DEFF}$ and $W_{DEFF}$ denote an effective channel length and an effective channel width of said two driver MOSFETs, respectively, and $L_{TEFF}$ and $W_{TEFF}$ denote an effective channel length and an effective channel width of said two transfer MOSFETs, respectively, and wherein a current flowing into the active load FETs is set to be greater than $1 \times 10^{-8}$ A.

10. A semiconductor memory according to claim 9, wherein said active loads FETs consist of polysilicon thin film transistors (TFTs).

11. A semiconductor memory according to claim 10, wherein a condition, $t_W<t_{cycle}$, is established where $t_{WD}$ denotes the width of a voltage pulse on a word line that renders said two transfer MOSFETs conductive and $t_{cycle}$ denotes the minimum cycle time of the semiconductor memory, in order to provide a time during which said two transfer MOSFETs become nonconductive, and one node in said memory cell is electrically charged by said current of said polysilicon TFTs during said nonconductive time.

12. A semiconductor memory according to claim 11, wherein said two transfer MOSFETs are disposed so that the direction of the corresponding channels thereof are substantially in parallel with the channel direction of said two driver MOSFETs.

13. A semiconductor memory according to claim 12, wherein the driver and transfer MOSFETs are n-channel conductive type and said active load FETs are p-channel conductivity type.

14. A semiconductor memory according to claim 10, wherein said two transfer MOSFETs are disposed so that the direction of the corresponding channels thereof are substantially in parallel with the channel direction of said two driver MOSFETs.

15. A semiconductor memory according to claim 9, wherein the driver and transfer MOSFETs are n-channel conductivity type and said active load FETs are p-channel conductivity type.

16. A semiconductor memory according to claim 10, wherein the driver and transfer MOSFETs are n-channel conductivity type and said active load FETs are p-channel conductivity type.

* * * * *